(12) United States Patent
Myers et al.

(10) Patent No.: US 10,427,538 B2
(45) Date of Patent: Oct. 1, 2019

(54) VEHICLE THERMAL MANAGEMENT SYSTEM WITH VORTEX TUBE

(71) Applicant: Ford Global Technologies, LLC, Dearborn, MI (US)

(72) Inventors: Eric Myers, Howell, MI (US); John Peter Bilezikjian, Canton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 233 days.

(21) Appl. No.: 15/479,628

(22) Filed: Apr. 5, 2017

(65) Prior Publication Data

US 2018/0290547 A1 Oct. 11, 2018

(51) Int. Cl.
| | |
|---|---|
| *B60L 58/24* | (2019.01) |
| *B60L 11/18* | (2006.01) |
| *F25B 9/04* | (2006.01) |
| *H05K 7/20* | (2006.01) |
| *F25B 49/00* | (2006.01) |

(52) U.S. Cl.
CPC ............ *B60L 11/187* (2013.01); *B60L 58/24* (2019.02); *F25B 9/04* (2013.01); *F25B 49/00* (2013.01); *H05K 7/20* (2013.01); *H05K 7/20863* (2013.01); *H05K 7/20872* (2013.01); *H05K 7/20909* (2013.01); *H05K 7/20927* (2013.01); *B60L 2240/545* (2013.01); *F25B 2600/2507* (2013.01); *Y02T 10/7005* (2013.01)

(58) Field of Classification Search
CPC .......................... B60L 11/187; B60L 11/1874; B60L 11/1803; B60L 11/1812; B60L 11/1816; B60L 58/24; B60L 2240/545; F25B 49/00; F25B 9/04; F25B 21/04; H05K 7/20872; H05K 7/20; H05K 7/20909; H05K 7/20927; H05K 7/20863; Y02T 10/7005; F25G 2600/2507
See application file for complete search history.

(56) References Cited

U.S. PATENT DOCUMENTS

| | | | |
|---|---|---|---|
| 2,920,457 A | 1/1960 | Bartlett, Jr. | |
| 3,090,208 A | 5/1963 | Munakata | |
| 3,191,628 A * | 6/1965 | Kirkwood | F16K 11/0853 137/312 |
| 3,208,229 A | 9/1965 | Fulton | |
| 3,299,662 A * | 1/1967 | Harnish | F25B 13/00 62/324.6 |

(Continued)

FOREIGN PATENT DOCUMENTS

| | | | |
|---|---|---|---|
| CN | 203746996 U | 7/2014 | |
| KR | 101661667 B1 * | 9/2016 | ......... B60H 1/00278 |

OTHER PUBLICATIONS

Notice of Allowance for U.S. Appl. No. 15/479,638, dated Apr. 3, 2019, 17 pages.

*Primary Examiner* — Emmanuel E Duke
(74) *Attorney, Agent, or Firm* — David Kelley; Brooks Kushman P.C.

(57) ABSTRACT

A thermal management system for a vehicle includes a vortex tube configured to generate hot and cold airstreams and a valve having hot and cold air inlets connected to the vortex tube to receive the hot and cold airstreams, respectively. The valve further has a vent and a valve outlet. A high-voltage electrical component is connected to the valve outlet by conduit to receive one of the hot and cold airstreams to thermally regulate the component.

16 Claims, 8 Drawing Sheets

(56) References Cited

U.S. PATENT DOCUMENTS

| | | | |
|---|---|---|---|
| 3,419,827 A * | 12/1968 | Webb | H01P 1/122 |
| | | | 137/625.23 |
| 3,730,203 A * | 5/1973 | Katzer | F17D 1/08 |
| | | | 137/14 |
| 3,788,064 A | 1/1974 | Hawkins | |
| 3,815,375 A | 6/1974 | Inglis | |
| 3,889,484 A | 6/1975 | Vander Horst et al. | |
| 4,240,261 A | 12/1980 | Inglis | |
| 4,646,524 A | 3/1987 | Kawashima et al. | |
| 5,582,012 A | 12/1996 | Tunkel et al. | |
| 5,819,541 A | 10/1998 | Tunkel et al. | |
| 6,250,086 B1 | 6/2001 | Cho et al. | |
| 6,401,463 B1 | 6/2002 | Dukhan et al. | |
| 7,751,188 B1 | 7/2010 | French et al. | |
| 8,402,773 B2 | 3/2013 | Broerman | |
| 8,656,720 B1 | 2/2014 | Hardgrave | |
| 8,716,981 B2 | 5/2014 | Arseneault et al. | |
| 8,820,095 B2 | 9/2014 | Lessig et al. | |
| 8,937,482 B1 * | 1/2015 | Lemczyk | G01R 31/2875 |
| | | | 324/750.04 |
| 9,080,793 B2 | 7/2015 | Tatarinov et al. | |
| 9,212,751 B2 * | 12/2015 | McLane | F16K 5/0471 |
| 9,242,207 B2 | 1/2016 | Park | |
| 2002/0062650 A1 * | 5/2002 | Dukhan | H05K 7/20145 |
| | | | 62/5 |
| 2005/0257533 A1 | 11/2005 | Gunawardana et al. | |
| 2014/0260335 A1 | 9/2014 | Beeler | |
| 2017/0241673 A1 | 8/2017 | Kawamata | |
| 2017/0349059 A1 * | 12/2017 | Xu | H02P 27/08 |

\* cited by examiner

VEHICLE THERMAL MANAGEMENT SYSTEM WITH VORTEX TUBE

TECHNICAL FIELD

The present disclosure relates to thermal management systems for heating and cooling a component of a vehicle, and more specifically to a thermal management system including a vortex tube.

BACKGROUND

The need to reduce fuel consumption and emissions in automobiles and other vehicles is well known. Vehicles are being developed that reduce, or completely eliminate, reliance on internal-combustion engines. Electric and hybrid vehicles are one type of vehicle currently being developed for this purpose. Electric and hybrid vehicles include one or more traction motors/generators that are powered by a traction battery. Electricity from the battery is conditioned by power electronics to provide the desired voltage and current to the motor. The power electronics include an inverter, an inductor, circuits, DC/DC converter, and controllers. The traction battery, the motors/generators, and the power electronics may require a thermal management system to regulate the temperate of the components to achieve optimum operating conditions.

SUMMARY

According to one embodiment, a thermal management system for a vehicle includes a vortex tube configured to generate hot and cold airstreams and a valve having hot and cold air inlets connected to the vortex tube to receive the hot and cold airstreams, respectively. The valve further has a vent and a valve outlet. A high-voltage electrical component is connected to the valve outlet by conduit to receive one of the hot and cold airstreams to thermally regulate the component.

According to another embodiment, a vehicle includes a vortex tube having hot and cold air outlets configured to port hot and cold airstreams generated by the vortex tube. A valve assembly has hot and cold air inlets in fluid communication with the hot and cold air outlets, respectively, and a vent and a valve outlet each configured to selectively discharge the hot or cold airstreams. The valve assembly further has a valve actuatable to route the hot airstream to the valve outlet and the cold airstream to the vent when in a heating position. A high-voltage system of the vehicle includes a component requiring thermal management. The component has a housing connected to the valve outlet by conduit and arranged to receive one of the hot and cold airstreams from the conduit to heat or cool the component depending upon a position of the valve.

According to yet another embodiment, a vehicle includes a vortex tube that generates hot and cold airstreams. A valve is connected to the vortex tube to receive the hot and cold airstreams and has a vent and an outlet. A component is in fluid communication with the outlet. A controller is programmed to actuate the valve to a heating position routing the hot airstream to the outlet, and actuate the valve to a cooling position routing the hot airstream to the vent.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
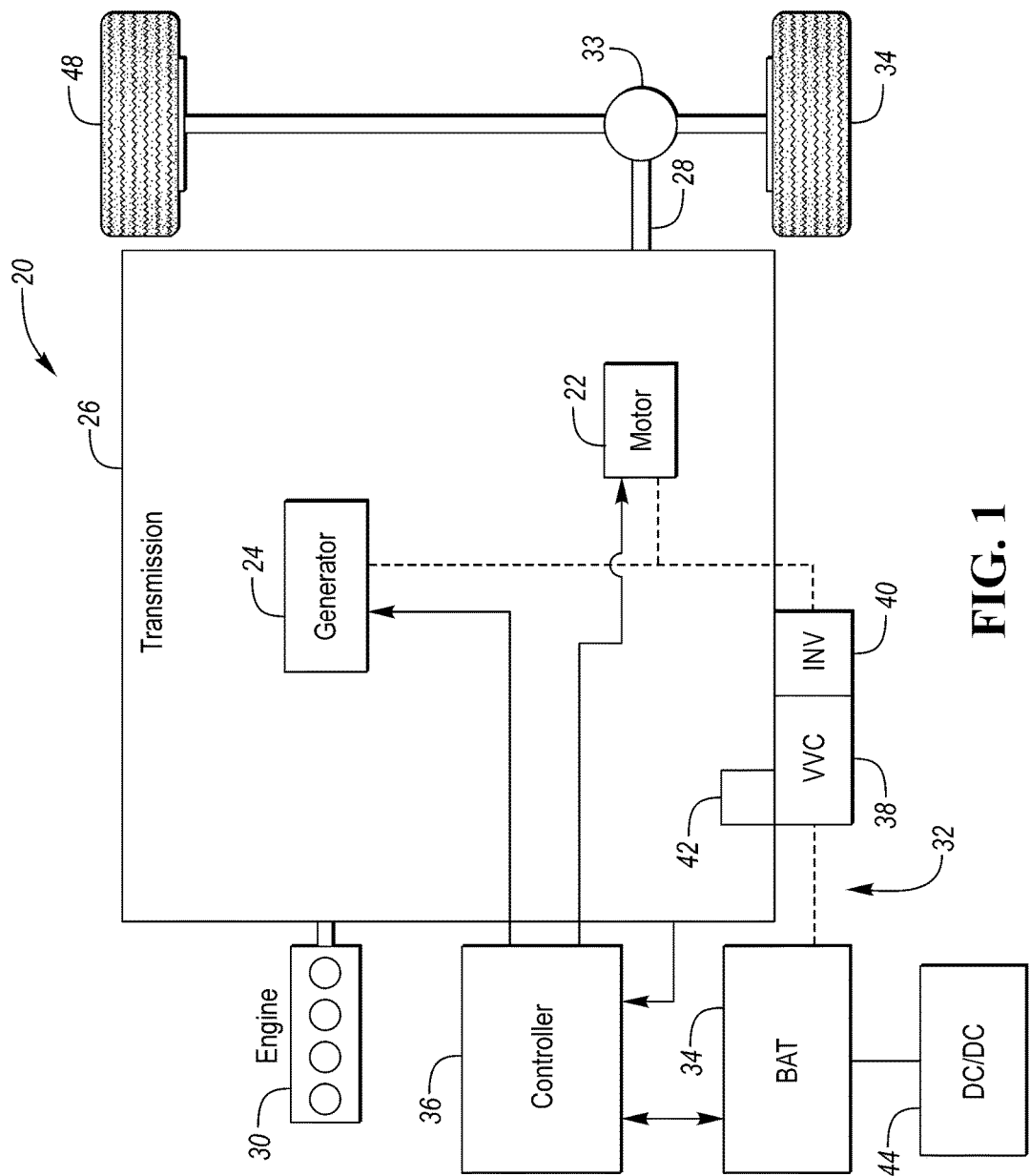
FIG. 1 is a schematic diagram of an example hybrid vehicle.

Referring to FIG. 1, an example plugin-hybrid electric vehicle (PHEV) is depicted and referred to generally as vehicle 20. The vehicle 20 includes a hybrid powertrain having a transmission 26, at least one electric machine such as motor 22 and generator 24, and an internal combustion engine 30. Each electric machine may be an alternating current (AC) electric motor. The at least one electric machine receives electrical power and provides torque for vehicle propulsion. The at least one electric machine also functions as a generator for converting mechanical power into electrical power through regenerative braking.

The transmission 26 may be a power-split configuration. The transmission 26 may house the motor 22 and the generator 24. A transmission output gear is connected to a driveshaft 28 that is connected to a pair of driven wheels 35 through a differential 33. In other embodiments, the transmission may not have a power-split configuration.

The vehicle 20 includes a high-voltage system 32 for providing power to the motor 22 and the generator 24. The high-voltage system 32 includes an energy storage device, such as a traction battery 34 for storing electrical energy. The battery 34 is a high-voltage battery that is capable of outputting electrical power to operate the motor 22 and the generator 24 when they operate as motors. The battery 34 also receives electrical power from the motor 22 and the generator 24 when they are operating as generators. The battery 34 may be a battery pack made up of several battery modules (not shown), where each battery module contains a plurality of battery cells (not shown) that may be arranged in arrays. Other embodiments of the vehicle 20 contemplate different types of energy storage devices, such as capacitors and fuel cells (not shown) that supplement or replace the battery 34. A high-voltage bus electrically connects the battery 34 to the motor 22 and the generator 24.

The vehicle includes a controller 36 for controlling the vehicle operations. The controller 36 may be a plurality of controllers including a battery energy control module, a transmission control module, a vehicle system controller, and others. The controller 36 is configured to receive inputs and to output control signals to various components of the vehicle including the battery 34, the engine 30, the motor 22, the generator 24, and the transmission 26. The vehicle controller 36 generally includes any number of microprocessors, ASICs, ICs, memory (e.g., FLASH, ROM, RAM, EPROM and/or EEPROM) and software code to co-act with one another to perform a series of operations. The controller 36 also includes predetermined data, or "look up tables" that are based on calculations and test data and stored within the memory. The controller 36 communicates with other vehicle systems and controllers over one or more wired or wireless vehicle connections using common bus protocols (e.g., CAN and LIN). Used herein, any reference to "a controller" refers to one or more controllers.

The high-voltage system 32 further includes a DC/DC converter 44, a variable voltage converter (VVC) 38, and an inverter 40. The VVC 38 and the inverter 40 are electrically connected between the traction battery 34 and the motor 22, and between the battery 34 and the generator 24. The VVC 38 "boosts" or increases the voltage potential of the electrical power provided by the battery 34. The VVC 38 also "bucks" or decreases the voltage potential of the electrical power provided to the traction battery 34, according to one or more embodiments. The inverter 40 inverts the DC power supplied by the traction battery 34 (through the VVC 38) to AC power for operating the electric machines 22, 24. The inverter 40 also rectifies AC power provided by the electric machines 22, 24, to DC for charging the traction battery 34. Other embodiments of the transmission 26 include multiple inverters (not shown), such as one invertor associated with each electric machine 22, 24. The VVC 38 includes an inductor assembly 42.

In addition to providing energy for propulsion, the traction battery 34 may provide energy for other vehicle electrical systems. The DC/DC converter module 44 may convert the high voltage DC output of the traction battery 34 to a low voltage DC supply that is compatible with other vehicle components. Other high-voltage loads, such as compressors and electric heaters, may be connected directly to the high-voltage supply without the use of a DC/DC converter module 44. In a typical vehicle, the low-voltage systems are electrically connected to an auxiliary battery (not shown). Used herein, the term high-voltage refers to a working voltage greater than 30 volts AC or 60 volts DC. Although illustrated and described in the context of a PHEV 20, it is understood that the disclosure is equally applicable to other types of vehicles, such as fully electric vehicles.

One or components of the vehicle 20, such as the traction battery 34, the VVC 38, the inverter 40, the DC/DC 44, and the inductor 42, and the controller 36 may require thermal regulation to ensure optimal performance. The following figures and associated text describe example thermal management systems, and components thereof, for thermally regulating one or more components of the high-voltage system 32 and other vehicle components.

Figure 2:
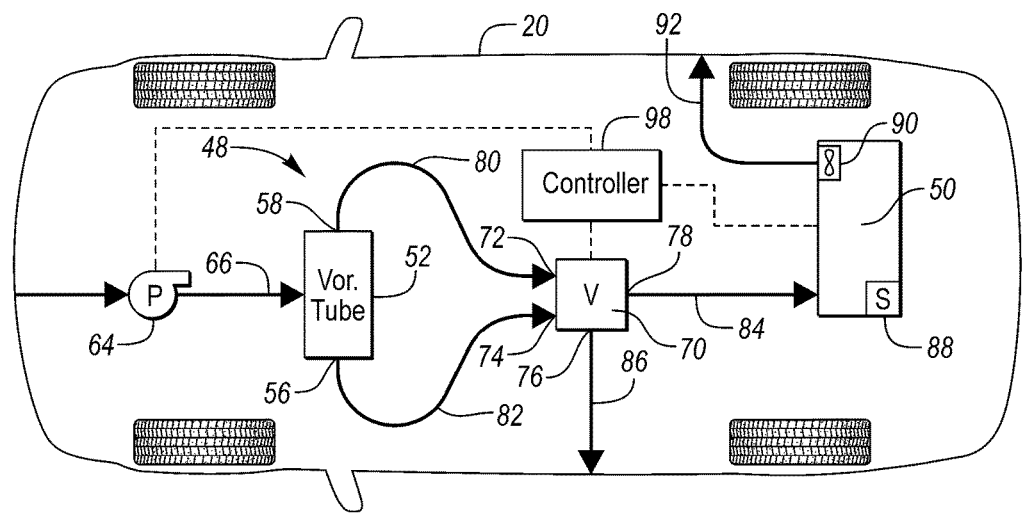
FIG. 2 is a schematic diagram of an air-cooled thermal management system for a high-voltage system of the vehicle.
Figure 3:
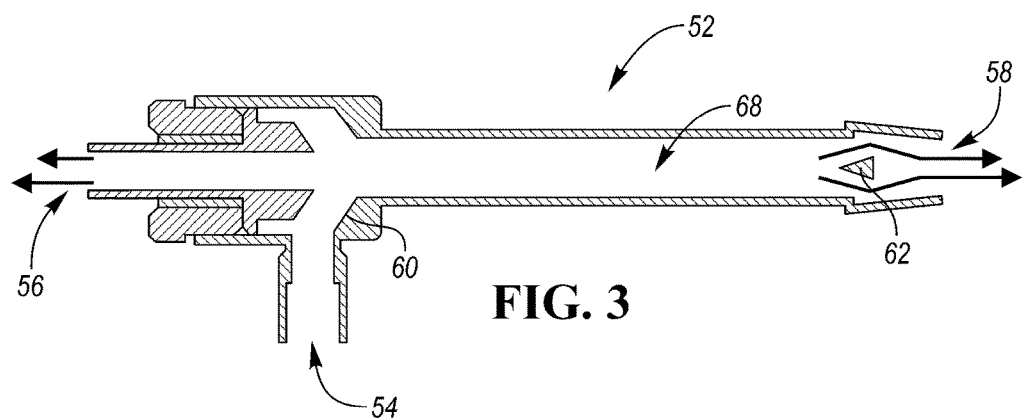
FIG. 3 is a schematic diagram of a vortex tube of the thermal management system of FIG. 2.

Referring to FIGS. 2 and 3, a thermal management system 48 may be used to thermally regulate a component 50 of the high-voltage system 32 such as a traction battery, a VVC, an inverter, a DC/DC converter, a controller, or an inductor. The thermal management system 48 is an air-cooled system that uses air as the heat-transfer fluid. The thermal management system 48 includes a vortex tube 52 capable of generating hot and cold airstreams from compressed air drawn from outside the vehicle 20. The vortex tube 52 includes an inlet 54 that receives compressed air from a pump 64. The pump 64 is connected to the inlet 54 by conduit 66. Compressed air flows through the inlet 54 and into a vortex generator 60 that creates an outer air swirl that travels along a generation cylinder 68 towards a control valve 62. The outer air swirl becomes hot as it travels along the generation cylinder 68. The control valve 62 allows a portion of the outer air swirl to exit the vortex tube 52 through a hot air outlet 58 as a hot airstream. The control valve 62 forces the remaining air back through the generation cylinder 68 as an inner air swirl that travels within the outer air swirl. The inner air swirl transfers its heat to the outer air swirl causing the outer air swirl to become hotter and the inner air swirl to become colder. The inner air swirl exits the vortex tube 52 through a cold air outlet 56 as a cold airstream. U.S. Pat. No. 3,208,229, the contents of which are hereby incorporated by reference in their entirety, describes an example vortex tube that may be utilized with the thermal management system 48.

The temperature differential between the hot and cold airstreams may be quite large. For example, the hot airstream may exit the vortex tube at a temperature of 100° Celsius (C) and the cold airstream may exit the vortex tube at a temperature of −40° C., or the temperature differential may be 30° C. As used herein, the terms "hot" and "cold" are terms of relativeness. A "hot airstream" refers to an airstream having a temperature greater than ambient, and "cold airstream" refers to an airstream having a temperature less than ambient.

The vortex tube 52 is connected to a diverter valve 70 that selectively supplies the hot or cold airstreams to the component 50. The valve 70 may include a hot air inlet 72 connected to the hot air outlet 58 by conduit 80, and a cold air inlet 74 connected to the cold air outlet 56 by conduit 82. In other embodiments, the vortex tube and the valve may be packaged as a single unit. The valve 70 may include internal components actuatable to route one of the hot and cold airstreams to a valve outlet 78 and to route the other of the hot and cold airstreams to a vent 76 depending upon the position of the valve. The valve outlet 78 is connected to an inlet of the component 50 by conduit 84. Air exiting the vent 76 is routed outside the vehicle 20 by conduit 86. In some embodiments, the vent 76 may be connected in fluid communication with another vehicle fluid loop to heat or cool another component rather than directly exhausting the airstream outside of the vehicle.

The controller 98 controls operation of the valve 70 to provide the hot or cold airstreams to the component 50 depending upon the temperature of the component. The component 50 may include one or more temperature sensors 88 configured to output a signal to the controller 98 indicative of a temperature of the battery. If the battery is above a first threshold temperature, then the controller 98 may actuate the valve 70 to output the cold airstream to cool the battery. If the battery is below a second threshold temperature, then the controller 98 may actuate the valve 70 to output the hot airstream to heat the battery.

The air entering the component 50 may be routed through one or more plenums and passageways to cool individual portions of the component. The component may have a housing defining an air chamber through which air is circulated. Heat generating portions of the component 50 may include fins disposed in the chamber to transfer thermal energy to and from the passing airstream. A fan 90, or other lower pressure generating device, may be disposed within the air chamber to maintain proper velocity of the airstream and to reduce back pressure on the thermal management system 48. Air exiting the component 50 may be routed outside the vehicle 20 by an exhaust conduit 92 as illustrated, or may be routed to another vehicle component.

Figure 4:
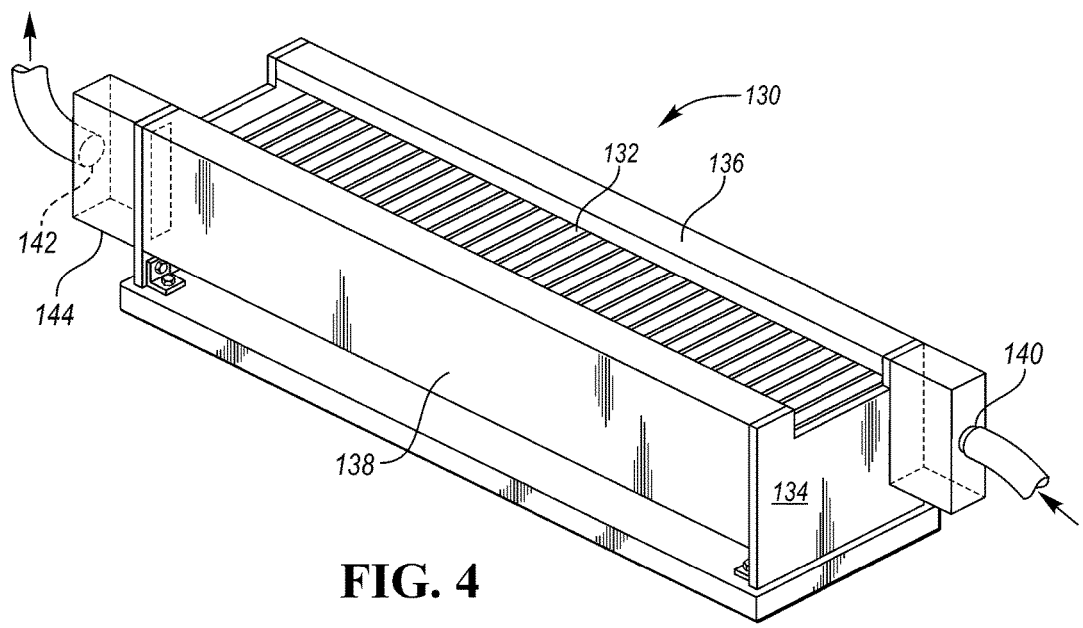
FIG. 4 is a perspective view of a traction battery of the high-voltage system according to one or more embodiments.

Referring to FIG. 4, the component 50 may be a traction battery assembly such as example air-cooled traction battery 130. Of course, other types of air-cooled traction batteries are known and this disclosure is not limited to any particular design. The battery 130 includes an array of battery cells 132 that are sandwiched between a pair of endplates 134. An inlet plenum 136 is disposed on one side of the array and an outlet plenum 138 is disposed on the other side of the array. The battery cells 132 are stacked in the array so that air passages are defined between the individual cells. The air passages are in fluid communication with the plenums 136 and 138 and allow air to flow from the inlet plenum 136, through the array of cells, and into the outlet plenum 138. The airstream passing through the cells 132 either heats or cools the cells depending upon operating conditions. Spacers may be provided between the cells 132 to create the air passages.

The inlet plenum 136 may include an inlet port 140 that is connected to conduit, such as conduit 84, that connects the inlet port 140 with the outlet of the diverter valve, e.g., outlet 78. The battery 130 may include a fan 144 to increase air circulation through the battery and to reduce back pressure on the system. The fan 144 may be located at the distal end of the outlet plenum 138. The outlet plenum 138 includes an outlet port 142 that is connected to a battery-exhaust conduit, such as conduit 92.

Figure 5:
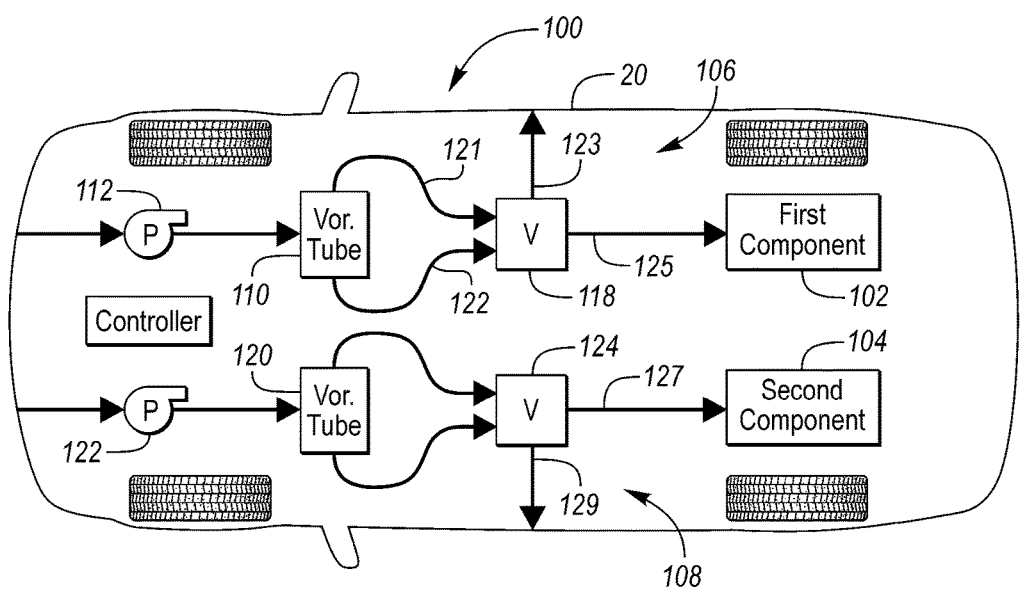
FIG. 5 is a schematic diagram of another air-cooled thermal management system for the high-voltage system of the vehicle.

Referring to FIG. 5, another thermal management system 100 is configured to thermally regulate a first component 102 and a second component 104 of the high-voltage system 32 such as a traction battery, an inverter, a VVC, a DC/DC converter, and/or an inductor.

Thermal management system 100 may include a first cooling subsystem 106 and a second cooling subsystem 108. These two subsystems may be capable of operating independently of each other. For example, the first subsystem 106 may be capable of heating the first component 102 while the second subsystem 108 is simultaneously cooling second component 104.

The first subsystem 106 includes a vortex tube 110 configured to generate hot and cold airstreams from compressed air supplied by a pump 112. The hot and cold airstreams are supplied to a diverter valve 118 by conduit 121 and conduit 122, respectively. The valve 118 is configured to selectively provide the airstreams to either the first component 102 via conduit 125 or to the outside air via conduit 123 depending upon thermal needs of the first component 102. If the first component 102 is being cooled, the cold airstream is routed to the first component 102 and the hot airstream is exhausted to the atmosphere, and, if the first component 102 is being heated, the hot airstream is routed to the component 102 and the cold airstream is exhausted to the atmosphere.

The subsystem 108 also includes a vortex tube 120 configured to generate hot and cold airstreams from compressed air supplied by a pump 122. Similar to subsystem 106, the subsystem 108 also includes a diverter valve 124 that selectively supplies the hot and cold airstreams to the second component 104 depending upon if the second component is being heated or cooled. If the component 104 is being cooled, the cold airstream is routed to the component 104 by conduit 127 and the hot airstream is exhausted to the atmosphere by conduit 129, and, if the battery is being heated, the hot airstream is routed to the component 104 and the cold airstream is exhausted to the atmosphere. In other embodiments, the unused airstream may be routed to other vehicle components rather than exhausted to the atmosphere.

Figure 6A:
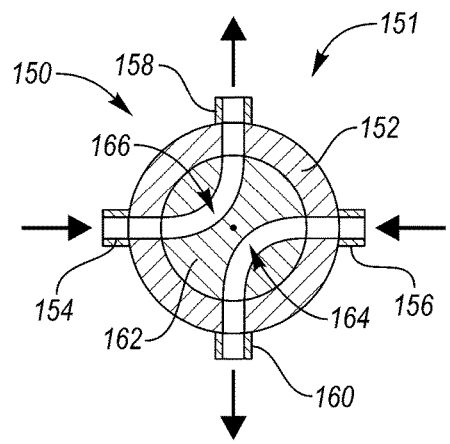
FIG. 6A is a cross-sectional view of a rotary diverter valve shown in a cooling position.
Figure 6B:
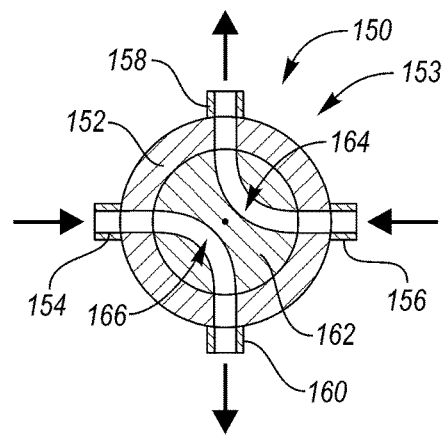
FIG. 6B is a cross-sectional view of the rotary diverter valve shown in a heating position.

FIGS. 6A-7B illustrate example diverter valves that may be used with the thermal management systems 48, 100, or similar system. Other types of valves are known by persons skilled in the art and this disclosure is not limited to any particular valve design. Referring to FIGS. 6A and 6B, a rotary diverter valve 150 includes a body 152 defining a hot air inlet 154, a cold air inlet 156, a vent 158, and a valve outlet 160. The hot air inlet 154 is connected to the hot air outlet of a vortex tube by conduit, e.g., conduit 80, and the cold air inlet 156 is connected to the cold air outlet of the vortex tube by conduit, e.g., conduit 82.

The body 150 may define a cylindrical bore that receives an inner cylinder 162. The inner cylinder 162 is rotatable relative to the body 152 and defines a first fluid channel 164 and a second fluid channel 166. The fluid channels connect the hot and cold air inlets 154, 156 to either the vent 158 and the valve outlet 160 depending upon the rotational position of the inner cylinder 162 relative to the body 150. FIG. 6A illustrates the valve 150 actuated to a cooling position 151 in which the cold air inlet 156 is connected in fluid communication with the valve outlet 160 by the first fluid channel 164 and the hot air inlet 154 is connected in fluid communication with the vent 158 by the second fluid channel 166. The valve 150 may be actuated to a heating position 153 by rotating the inner cylinder 162 so that the hot air inlet 154 is connected in fluid communication with the valve outlet 160 via the channel 166 and the cold air inlet 156 is connected in fluid communication with the vent 158 via the channel 164. The valve 150 may include an electric motor (not shown) or other device that rotates the inner cylinder 162 to switch the valve 150 between the heating position 153 and the cooling position 151.

Figure 7A:
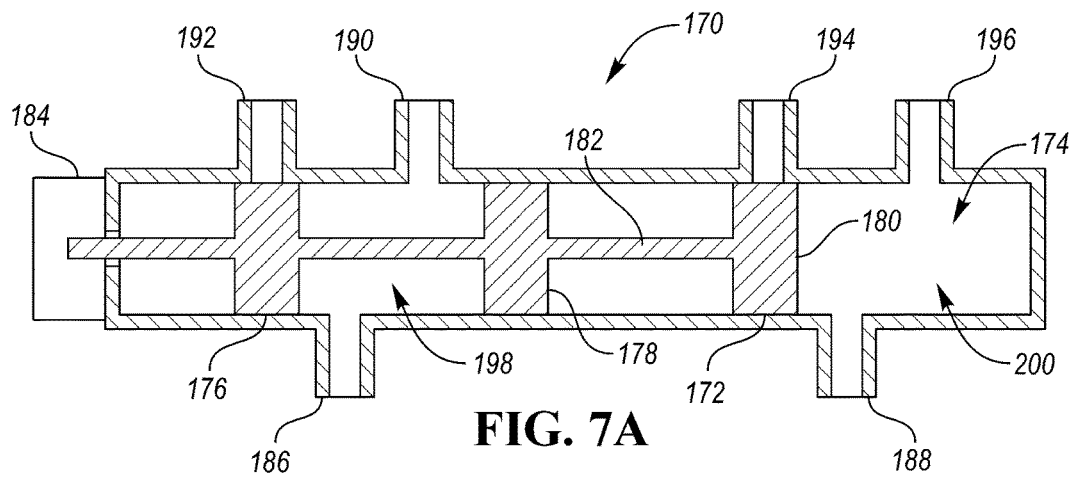
FIG. 7A is a cross-sectional view of a spool valve shown in a heating position.
Figure 7B:
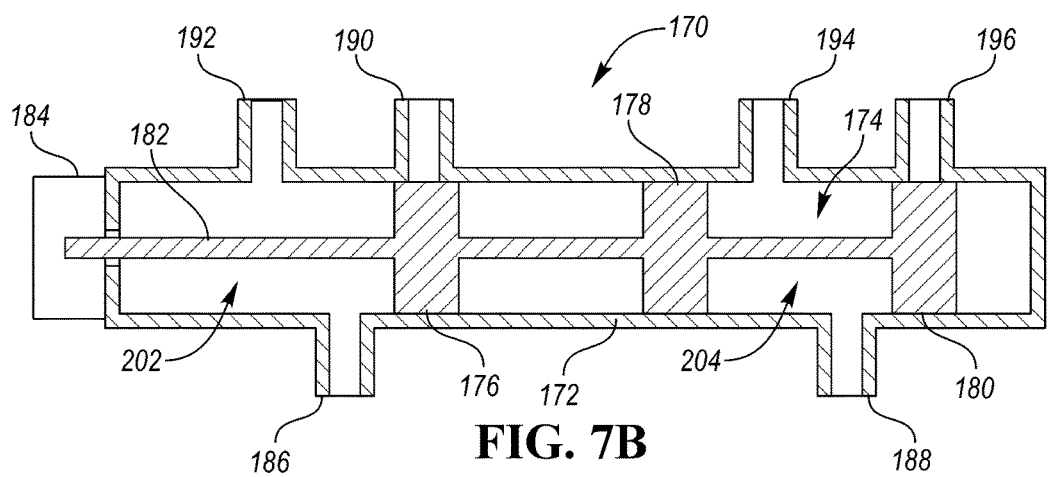
FIG. 7B is a cross-sectional view of the spool valve shown in a cooling position.

Referring to FIGS. 7A and 7B, in other embodiments the diverter valve may be a spool valve, such as spool valve 170. The spool valve 170 includes a valve body 172 defining a valve bore 174 that may be cylindrical in shape. A plurality of lands such as a first land 176, a second end 178, and a third land 180 are disposed within the valve bore 174. The lands may be disk-shaped having a diameter that approximates the diameter of the bore 174. The edges of the lands engage with the walls of the bore 174 to form an air-tight seal. Each of the lands are supported on a spool 182 at spaced intervals to define air passageways between adjacent lands.

The valve body 172 defines a hot air inlet 186 that is in fluid communication with the hot air outlet of the vortex tube and a cold air inlet 188 is in fluid communication with the cold air outlet of the vortex tube. One or more conduits, such as conduits 80 and 82, may connect between the valve body 172 to the vortex tube. Unlike the valve 150, which had a shared vent 158 and a shared valve outlet 160, the spool valve 170 has a dedicated outlet and a dedicated vent for each hot and cold air inlet. For example, the valve body 172 defines a hot air outlet 190, a hot air vent 192, a cold air outlet 194, and a cold air vent 196. The hot and cold air outlets 190, 194 are in fluid communication with the component to be thermally regulated, such as component 50, and the vents 192, 196 are connected to conduits that route the vented airstreams outside the vehicle or to other vehicle components.

The spool 182 is axially movable within the bore 174 to switch the valve 150 between at least a heating position (FIG. 7A) and a cooling position (FIG. 7B). The valve 170 includes an actuator 184 operable to move the spool 182. The actuator may be an electric motor or a linear motor. In the heating position, the spool 182 is positioned so that the first land 176 closes the hot air vent 192 and the hot air outlet 190 is open. A first fluid channel 198 is defined between the first and second lands 176, 178 to route the hot airstream from the hot air inlet 186 to the hot air outlet 190. The cold air outlet 194 is closed by the third land 180 and the cold air vent 196 is open. A second fluid channel 200 is defined between the third land 180 and an end of the bore 174 to route the cold airstream from the cold air inlet 188 to the vent 196.

In the cooling position, the spool 182 is positioned so that the first land 176 closes the outlet 190 and the vent 192 is open. A third fluid channel 202 is defined between an end of the bore 174 and the first land 176 to route the hot airstream to the vent 192. The vent 196 is closed by the third land 180 and the cold air outlet 194 is open. The second land 178 the third land 180 cooperate to define a fourth fluid channel 204 that routes the cold airstream from the inlet 188 to the outlet 194.

The controller 98 is programmed to operate the above described thermal management system 48 to effectuate thermal regulation of the component or components to be heated or cooled. Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but is provided for ease of illustration and description. The control logic may be implemented primarily in software executed by a microprocessor-based vehicle, engine, and/or powertrain controller, such as controller 98. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

Figure 8:
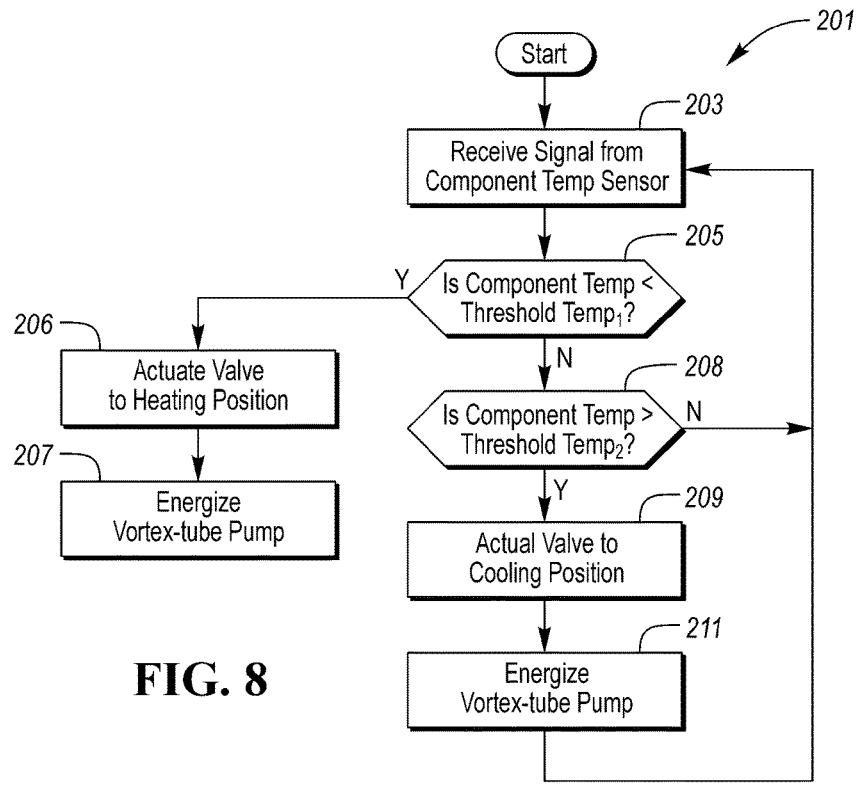
FIG. 8 is a flow chart illustrating an algorithm for operating a thermal management system of high-voltage system of the vehicle.

FIG. 8 is a flowchart 201 of an algorithm for controlling the thermal management system 48. Similar algorithms may be used to control thermal management system 100. The controller 98 receives a signal from the temperature sensor 88 indicative of a current temperature of the component 50 at operation 203. The controller 98 then compares the component temperature to a first threshold temperature ($temp_1$) to determine if the component 50 requires heating at operation 205. If the battery temperature is less than the first threshold temperature, control passes to operation 206 and the controller instructs the valve 70 to actuate to the heating position. In the heating position, the valve 70 routes the hot airstream to the component 50. The pump 64 is energized, if the pump is OFF, at operation 207 causing the vortex tube 52 to generate the hot and cold airstreams. The fan 90 is also energized at this time if it is OFF.

If no at operation 205, control passes to operation 206 and the controller 98 determines if the component temperature is greater than a second threshold temperature ($temp_2$). If no, control loops back to operation 203. If yes, control passes to operation 209 and the valve 70 is actuated to the cooling position. In the cooling position, the valve 70 routes the cold airstream to the component 50. At operation 211 the pump 64 is energized if it is OFF. The fan 90 is also energized at this time if it is OFF.

In the previous embodiments, the thermal management systems were air-cooled systems in which the hot and cold airstreams, generated by the vortex tube, were selectively circulated across the component/components to be thermally regulated. In the following embodiments, the thermal management systems include a coolant loop in which the component/components to be thermally regulated are liquid cooled by a liquid coolant, and a heat exchanger is used to transfer thermal energy between the hot and cold airstreams of the vortex tube and the coolant of coolant loop.

Figure 9:
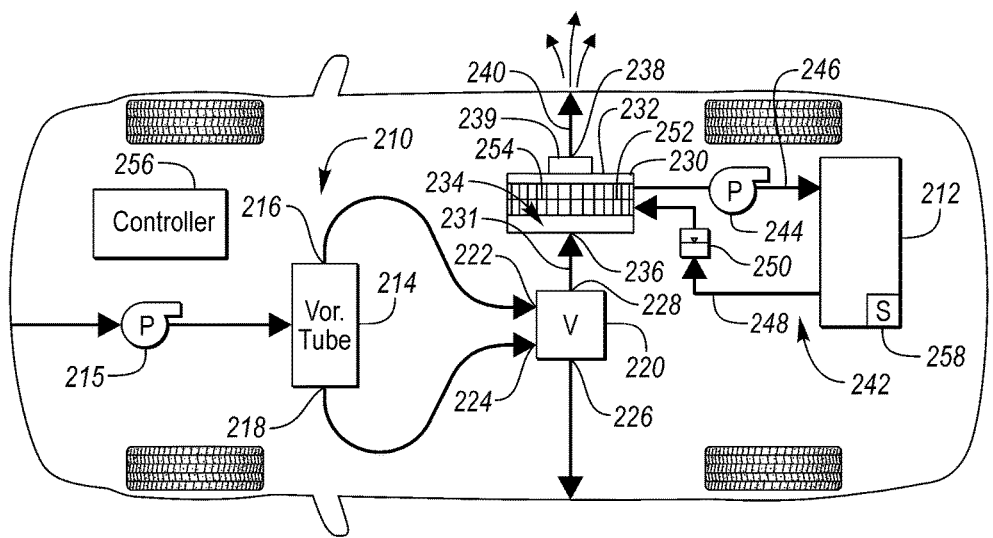
FIG. 9 is a schematic diagram of a liquid-cooled thermal management system for a high-voltage system of the vehicle.

Referring to FIG. 9, a thermal management system 210 may be used to thermally regulate a component 212 of the high-voltage system 32 such as a traction battery, a VVC, an inverter, an inductor, or other component. The thermal management system 210 includes a vortex tube 214 capable of generating hot and cold airstreams from compressed air provided by a pump 215.

Hot and cold air outlets 216 and 218 of the vortex tube 214 are connected in fluid communication with a diverter valve 220. The valve 220 includes a hot air inlet 222, a cold air inlet 224, a vent 226, and a valve outlet 228. Other valve designs may include dedicated inlets and outlets for each of the hot and cold airstreams. The valve 220 includes internal components actuatable to route one of the hot and cold airstreams to the valve outlet 228 and to route the other of the hot and cold airstreams to the vent 226 depending upon the thermal needs of the component 212. The valve 220 may be the same or similar to the illustrated valves disclosed herein, or may be any kind of valve known by those having ordinary skill in the art.

The valve outlet 228 is connected in fluid communication with a heat exchanger 230 by conduit 231. The heat exchanger 230 may include a housing 232 that defines an interior 234 for receiving an airstream from the valve outlet 228. The housing 232 may include an air inlet port 236 and air outlet port 238 for circulated air into and out of the interior 234. The inlet and outlet ports may be located on opposing sides of the housing 232. The inlet port 236 may be connected to the conduit 231, and the outlet port 238 may be connected to an exhaust conduit 240 that carries the exiting airstream outside of the vehicle 20. A fan 239 associated with the heat exchanger 230 draws air through the interior 234 to reduce back pressure on the system. The fan 239 may be external to the housing 232 or within the interior 234. The fan 239 may part of the heat exchanger 230 or may be a standalone unit located upstream or downstream of the heat exchanger 230.

A coolant system 242, associated with the component 212, is configured to circulate a liquid coolant, such as ethylene glycol, to heat and/or cool the component 212 as needed. The coolant system 242 includes a pump 244 for circulating the coolant. A supply line 246 carries coolant from the pump 244 to the component 212, and a return line 248 carries coolant back to the pump. A reservoir 250 may be connected to the return line 248.

The coolant system 242 is in fluid communication with the heat exchanger 230 so that thermal energy can be transferred between the coolant and the airstreams of the vortex tube 214. The heat exchanger 230 may include a heat-exchange element 252, commonly referred to as a core, disposed within the interior 234 between the inlet and outlet ports 236, 238 so that the airstream flowing through the housing 232 passes through the heat-exchange element 252. The heat-exchange element 252 may include tubes for conveying coolant and a plurality of fins 254 for exchanging thermal energy between the airstream and the coolant. The heat-exchange element 254 has inlet and outlet ports connected to the return line 248 and the supply line 246, respectively. During operation, the pump 244 circulates coolant through the heat-exchange element 252 to exchange thermal energy between the coolant and the airstream passing through the heat-exchange element 252.

A controller 256 may be electrically connected, either directly or indirectly, with at least the vortex tube 214, the pump 215, the valve 220, the heat exchanger 230, the pump 244, the component 212, and a temperature sensor 258. The controller 256 is programmed to receive inputs, such as a current temperature of the component 212 from the temperature sensor 258, determine the thermal needs of the component 212 based on these inputs, and output instructions to the various components of the thermal management system 210 to effectuate thermal regulation of the component 212.

Figure 10:
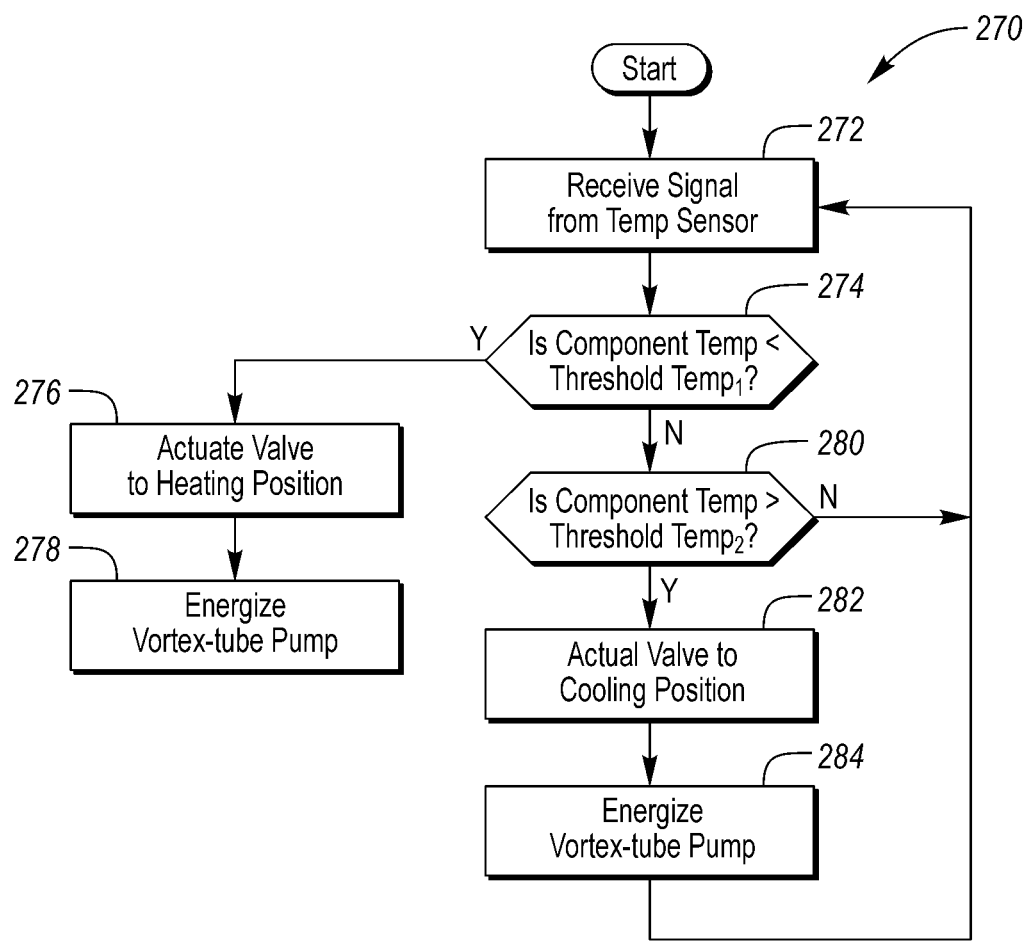
FIG. 10 is a flow chart illustrating an algorithm for operating the thermal management system of FIG. 9.

FIG. 10 illustrates an algorithm 270 for controlling the thermal management system 210. At operation 272 the controller 256 receives a signal from the battery temperature sensor 258 indicative of a current temperature of the component 212. The controller 256 then compares the component temperature to a first threshold temperature (temp$_1$) to determine if the component requires heating at operation 274. If the temperature is less than the first threshold temperature, control passes to operation 276 and the controller instructs the valve 220 to actuate to the heating position. In the heating position, the valve 220 is actuated so that the hot air inlet 222 is in fluid communication with the valve outlet 228 and the cold air inlet 224 is in fluid communication with the vent 226. This causes the hot airstream to be routed to the heat exchanger 230 and the cold airstream to be vented to the atmosphere or to another vehicle component. If the pump is OFF, it is energized at operation 278 causing the vortex tube 214 to generate the hot and cold airstreams. The pump 244 of the coolant system 242 is also energized at this time if it is OFF. The coolant system 242 may circulate coolant through the component 212 even when the component is not being actively cooled or heated to increase temperature uniformity of the component.

If no at operation 274, control passes to operation 280 and the controller determines if the component temperature is greater than a second threshold temperature (tempt). If no, control loops back to operation 272. If yes, control passes to 282 and the valve 220 is actuated to the cooling position. In the cooling position, the valve 220 is actuated so that the cold air inlet 224 is in fluid communication with the vent outlet 228 and the hot air inlet 222 is in fluid communication with the vent 226. This causes the cold airstream to be routed to the heat exchanger 230 and the hot airstream to be vented. At operation 284 the pump 215 is energized if it is OFF. The pump 244 of the coolant system 242 is also energized at this time if it is OFF.

Figure 11:
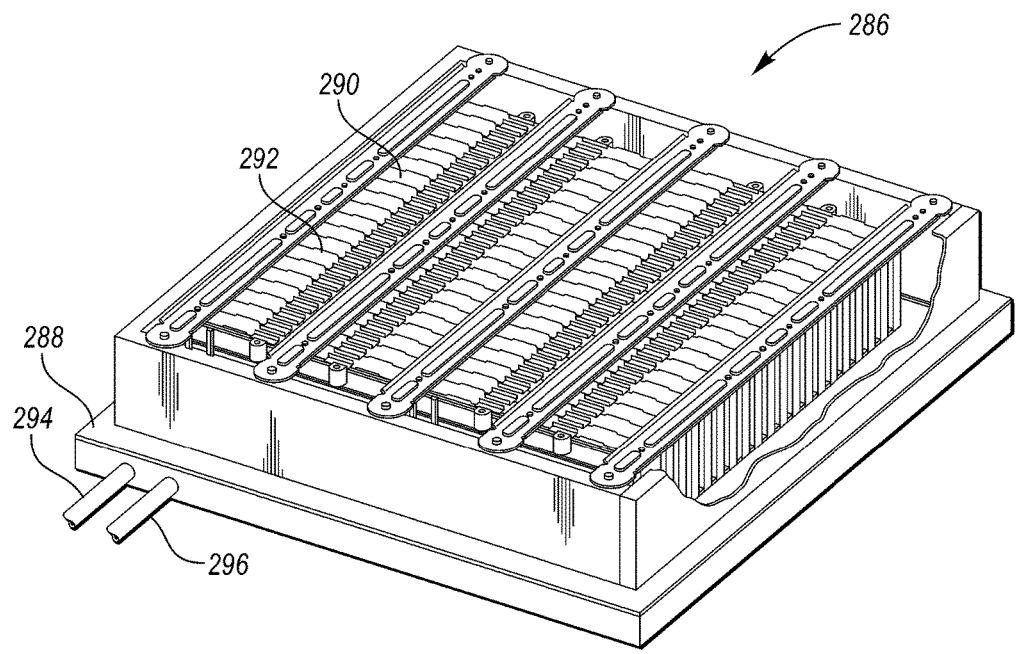
FIG. 11 is a perspective view of a traction battery of the high-voltage system according to one or more embodiments.

Referring to FIG. 11, in one or more embodiments, the component 212 is a traction battery 286 that may include a thermal plate 288 (also known as a cold plate) in fluid communication with the coolant system 242. The thermal plate 288 may include an inlet 294 connected to the supply line 246 and an outlet 296 connected to the return line 248. Battery arrays 290 are disposed on the plate 288 with cells 292 of the battery in thermal contact with a top of the thermal plate 288. Coolant is circulated through internal pipes of the thermal plate 288 so that heat is added or removed from the battery cells 292 to thermally regulate the battery 286. In other embodiments, a plurality of fins, in thermal communication with the coolant, may be interleaved with the cells 292 to thermally regulate the battery. Many types of liquid-cooled batteries are known to a person having ordinary skill in the art and this disclosure is not limited to any particular traction battery design.

Figure 12:
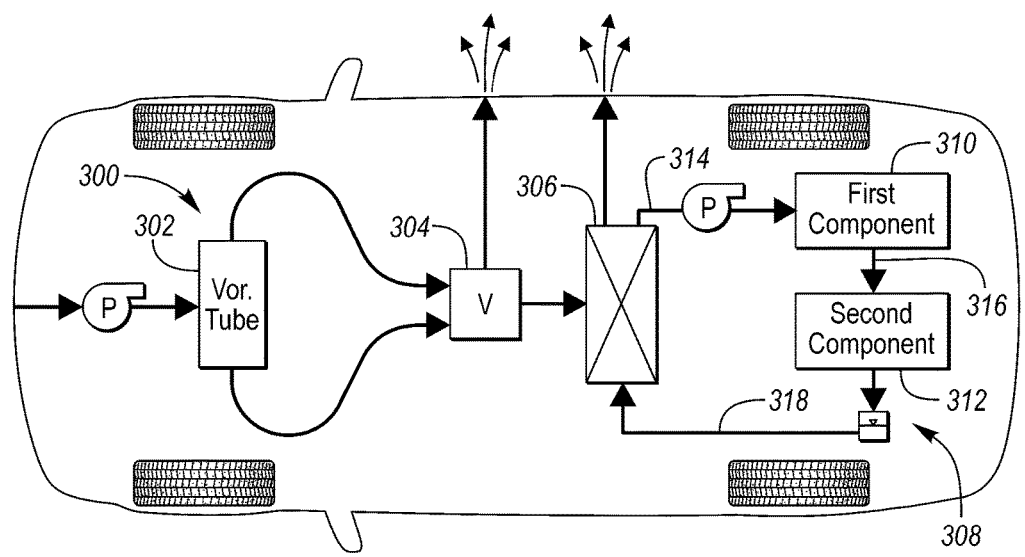
FIG. 12 is a schematic diagram of another liquid-cooled thermal management system for a high-voltage system of the vehicle.

Referring to FIG. 12, another thermal management system 300 is used to thermally regulate at least two components of the high-voltage system 32. The system 300 includes a vortex tube 302 in fluid communication with a valve 304 that selectively routes the hot and cold airstreams to a heat exchanger 306. The heat exchanger 306 is in fluid communication with a coolant loop 308 to add or remove heat from coolant circulating through the loop 308. The coolant loop 308 is arranged to thermally regulate a first component 310 and a second component 312 of the high-voltage system 32. The components 310, 312 may be arranged in series with coolant flowing from the heat exchanger 306 to the first component 310 by a first conduit 314 and subsequently flowing from the first component 310 to the second component 312 by a second conduit 316. A return conduit 318 connects between the second component 312 and the heat exchanger 306. The components 310, 312 may be arranged so that the first component 310 has a smaller thermal demand than the second component 312 so that the coolant entering the second component 312 is not too hot or too cold to thermally regulate the second component.

In other embodiments, the first and second component 310, 312 may be arranged in a parallel-cooling arrangement in which each component 310, 312 has a dedicated a loop. A single or multiple heat exchangers may be used in the parallel-cooling arrangement. One advantage of a parallel-cooling arrangements is that the upstream component does not affect the coolant temperature entering the downstream component.

The first and second components may be selected from a group consisting of: a traction battery assembly, an inverter, an inductor, a variable voltage converter, and an electronic control module. In one embodiment, the first component may be a traction battery and the second component may be an inverter. In another embodiment, the first component may be DC/DC converter and the second may be an electronic control module. Other combinations are contemplated by this disclosure.

Figure 13:
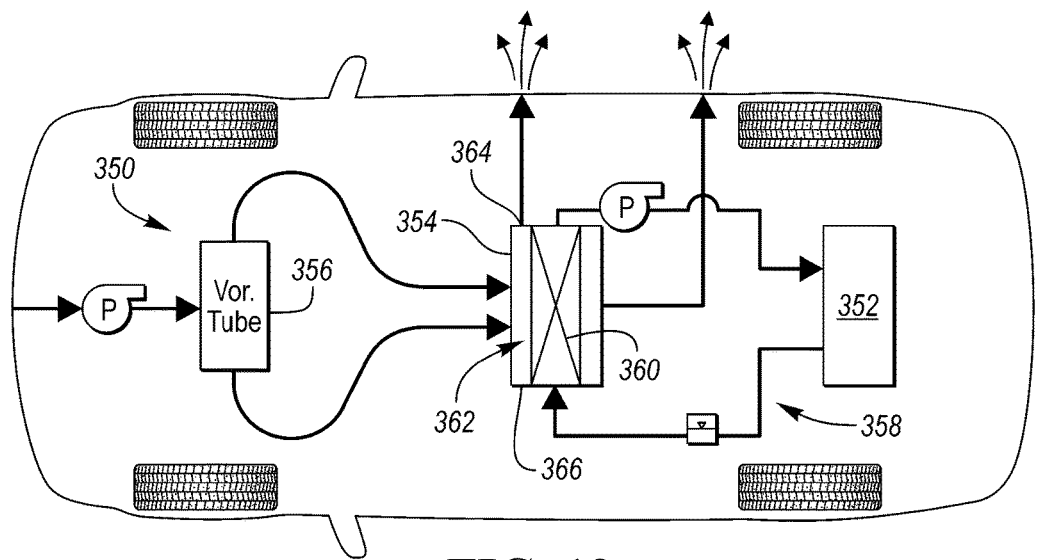
FIG. 13 is a schematic diagram of yet another liquid-cooled thermal management system for a high-voltage system of the vehicle.

Referring to FIG. 13, yet another thermal management system 350 is used to thermally regulate a component 352 such as a traction battery, an inductor, an inverter, or other component of the high-voltage system 32. The thermal management system 350 includes a vortex tube 356 configured to generate hot and cold airstreams used to heat or cool the component 352. The component 352 is liquid cooled and includes a coolant loop 358 configured to circulate coolant through the component 352. A heat exchanger 354 is in fluid communication with the vortex tube 356 and the coolant loop 358 to transfer thermal energy between the airstream and the coolant. A valve may be used to selectively route the hot or cold airstreams to the heat exchanger 354. In the previously illustrated embodiments, the valve and the heat exchanger were separate units, but, in other embodiments, the valve and the heat exchanger are integrated in a single assembly as shown in FIGS. 13 and 14.

The heat exchanger 354 has a heat-exchange element 360, commonly referred to as a core, disposed in a housing 366 of the heat exchanger 354. A valve 362 is also disposed in the housing 366 at a location upstream of the element 360. The valve 362 is configured to selectively route one of the hot and cold airstreams through the element 360 and route the other of the airstreams to a vent 364 defined in the housing 366. The element 360 is configured to transfer thermal energy between the coolant and the hot and cold airstreams generated by the vortex tube 356. When the component 352 is to be cooled, the valve 362 routes the cold airstream through the element 360, and when the component is to be heated, the valve 362 routes the hot airstream through the element 360. The valve 362 may be a spool valve such as the one shown in FIGS. 7A and 7B, a cylinder valve such as the one shown in FIGS. 6A and 6B, one or more doors, or any other type of valve known in the art.

Figure 14:
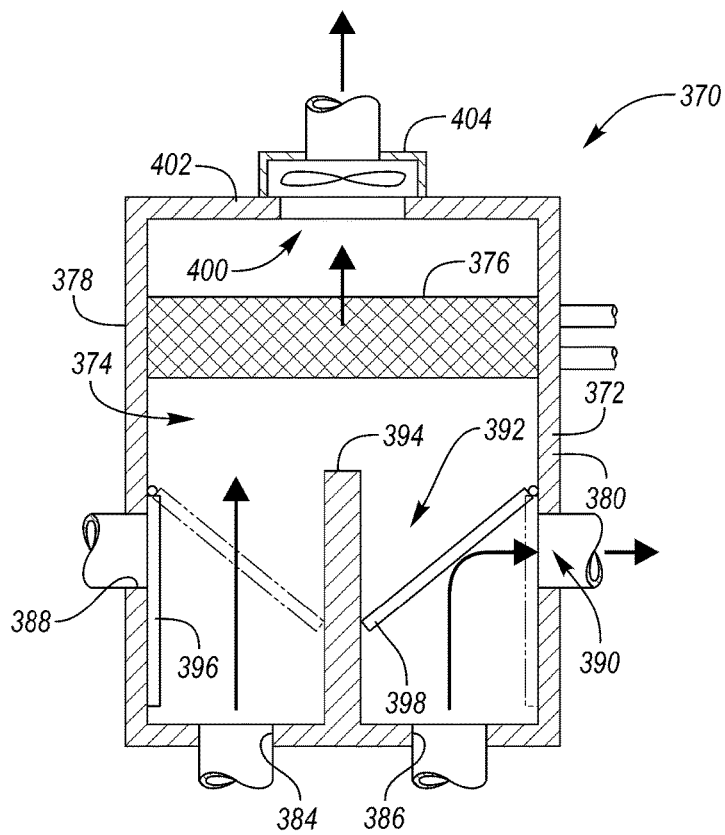
FIG. 14 is a cross-sectional view of a combined valve and heat-exchanger assembly according to one embodiment.

FIG. 14 illustrates an example heat exchanger 370 that may be used with the thermal management system 350. The heat exchanger 370 includes a housing 372 that defines an interior 374. A heat-exchange element 376, commonly referred to as a core, is disposed within the interior 374 and extends between a pair of sidewalls 378 and 380. The element 376 is in fluid communication with a coolant loop.

A front wall 382 of the housing 372 defines a hot air inlet 384 and a cold air inlet 386. The hot and cold air inlets 384, 386 receive hot and cold airstreams from the vortex tube, respectively. The housing 372 has a dividing wall 394 disposed between the inlets 384 and 386 to prevent the hot and cold airstreams from mixing. The housing 372 also has a hot air outlet 388 defined in the sidewall 378 and a cold air outlet 390 defined in the sidewall 380.

A valve 392 controls the flow of the hot and cold airstreams within the interior 374 of the heat exchanger 370 by either passing the airstream to the element 376 or diverting the airstream to its respective outlet. The valve 392 may include a hot air door 396 pivotally attached to the sidewall 378 and a cold air door 398 pivotally attach the sidewall 380. The hot air door 396 is pivotal between an open position in which the hot airstream is allowed to pass to the heat-exchange element 376 and a closed position in which the hot airstream is routed to the outlet 388. The cold air door 398 is pivotal between an open position in which the cold airstream is allowed to pass to the heat-exchange element 376 and a closed position in which the cold airstream is routed to the outlet 390. In FIG. 14, the hot air door 396 is shown in the open position and the cold air door 398 shown in the closed position, which is the heating position. (Phantom lines illustrate the doors in the cooling position).

A vent 400 is defined in a back wall 402 of the housing 372 to allow air to exit the heat exchanger 370. A fan 404 may be located proximate to the vent 400 to increase air circulation through the interior 374 and prevent back pressure on the system. The fan 404 may be located externally to the interior 374 as illustrated or may be disposed within the interior 374 in other embodiments.

While example embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A thermal management system for a vehicle comprising:
    a vortex tube configured to generate hot and cold airstreams;
    a valve including hot and cold air inlets connected to the vortex tube to receive the hot and cold airstreams, respectively, and including a vent and a valve outlet; and
    a high-voltage electrical component connected to the valve outlet by conduit to receive one of the hot and cold airstreams to thermally regulate the component.

2. The thermal management system of claim 1, wherein the component is selected from a group consisting of:
    a traction battery assembly;
    an inverter;
    an inductor;
    a variable voltage converter; and
    an electronic control module.

3. The thermal management system of claim 1, wherein the valve defines internal fluid channels arranged to route the hot airstream to the valve outlet and the cold airstream to the vent when the valve is in a heating position, and to route the cold airstream to the valve outlet and the hot air to the vent when the valve is in a cooling position.

4. The thermal management system of claim 1, wherein the valve includes a second valve outlet connected to the high-voltage electrical component by a second conduit and a second vent.

5. The thermal management system of claim 4, wherein the valve defines internal fluid channels arranged to selectively route the hot airstream to one of the vent and the valve outlet depending upon a position of the valve, and to selectively route the cold airstream to one of the second vent and the second valve outlet depending upon a position of the valve.

6. The thermal management system of claim 1, wherein the valve is a spool valve assembly including:
a body defining the hot air inlet, the cold air inlet, the valve outlet, and the vent, wherein the vent and the valve outlet are associated with the hot air inlet, the body further defining a second vent and a second valve outlet associated with the cold air inlet and defining a valve bore in fluid communication with the hot air inlet, the cold air inlet, the valve outlet, the second valve outlet, the vent, and the second vent, wherein the high-voltage electrical component is connected to the second valve outlet by conduit, and
a plurality of disk-shaped lands mounted to a spool and in sealing engagement with a periphery of the valve bore, wherein the lands are actuatable to a heating position in which the hot air inlet is connected in fluid communication with the valve outlet and the cold air inlet is connected in fluid communication with the second vent, and to a cooling position in which the hot air inlet is connected in fluid communication with the vent and the cold air inlet is connected in fluid communication with the second valve outlet.

7. A vehicle comprising:
a vortex tube including hot and cold air outlets configured to port hot and cold airstreams, respectively, generated by the vortex tube;
a valve assembly including a body defining a hot air inlet, a cold air inlet, a vent, and a valve outlet, the hot and cold inlets being in fluid communication with the hot and cold air outlets, respectively, and the vent and the valve outlet each being configured to selectively discharge the hot or cold airstreams, the valve assembly further including a rotory valve defining a first fluid channel and a second fluid channel, wherein the valve includes a heating position in which the valve is rotated so that the first fluid channel connects the hot air inlet to the valve outlet and the second channel connects the cold air inlet to the vent, and a cooling position in which the valve is rotated so that the first fluid channel connects the hot air inlet to the vent and the second channel connects the cold air inlet to the valve outlet; and
a high-voltage system including a component requiring thermal management, the component including a housing connected to the valve outlet by conduit and arranged to receive the hot airstream from the conduit in response to the valve being in the heating position and to receive the cold airstream in response to the valve being in the cooling position to heat or cool the component depending upon a position of the valve.

8. The vehicle of claim 7, wherein the component is a traction battery assembly.

9. The vehicle of claim 8 further comprising:
a second vortex tube including second hot and cold airstream outlets configured to port hot and cold airstreams generated by the vortex tube; and
a second valve assembly including second hot and cold air inlets in fluid communication with the hot and cold air outlets, respectively, and including a second vent and a second valve outlet, the second valve assembly further including a valve actuatable to route the hot airstream to the second valve outlet and the cold airstream to the second vent when in a heating position; wherein
the high-voltage system further includes a second component requiring thermal management, the second component including a housing connected to the second valve outlet by conduit and arranged to receive one of the hot and cold airstreams from the conduit to heat or cool the second component depending upon a position of the second valve.

10. The vehicle of claim 7 further comprising a controller programmed to:
in response to a heating instruction, actuate the valve to the heating position, and
in response to a cooling instruction, actuate the valve to the cooling position.

11. The vehicle of claim 7 further comprising:
a temperature sensor configured output a signal indicative of a temperature of the component and
a controller programmed to:
receive the signal,
in response to the component having a temperature greater than a first threshold, actuate the valve to the cooling position, and
in response to the component having a temperature less than a second threshold, actuate the valve to the heating position.

12. The vehicle of claim 7, wherein the component is selected from a group consisting of:
a traction battery assembly;
an inverter;
an inductor;
a variable voltage converter; and
an electronic control module.

13. A vehicle comprising:
a vortex tube including hot and cold air outlets configured to port hot and cold airstreams, respectively, generated by the vortex tube;
a valve assembly including a body defining a hot air inlet, a cold air inlet, a vent, and a valve outlet, the hot and cold inlets being in fluid communication with the hot and cold air outlets, respectively, and the vent and the valve outlet each being configured to selectively discharge the hot and cold airstreams, wherein the valve includes a heating position in which the valve is configured to discharge the hot airstream from the valve outlet and discharge the cold airstream to the vent, and a cooling position in which the valve is configured to discharge the cold airstream to the valve outlet and discharge the hot airstream to the vent;
a high-voltage electrical component in fluid communication with the outlet; and
a controller programmed to:
actuate the valve to the heating position in response to a temperature of the component being less than a first threshold, and actuate the valve to the cooling position in response to the temperature of the component being greater than a second threshold.

14. The vehicle of claim 13, wherein the valve assembly further including a rotory valve defining a first fluid channel and a second fluid channel, wherein the rotory valve includes a first position, corresponding with the heating position, in which the first and second fluid channels cooperate to discharge the hot airstream from the valve outlet and discharge the cold airstream from the vent, and a second position, corresponding with the cooling position, in which the first and second fluid channels cooperate to discharge the cold airstream from the valve outlet and discharge the hot airstream from the vent.

15. The vehicle of claim 14, wherein, in the first position, the first fluid channel connects the hot air inlet to the valve outlet and the second channel connects the cold air inlet to the vent, and, in the second position, the first fluid channel connects the hot air inlet to the vent and the second channel connects the cold air inlet to the valve outlet.

16. The vehicle of claim 13, wherein the component is selected from a group consisting of:
- a traction battery assembly;
- an inverter;
- an inductor;
- a variable voltage converter; and
- an electronic control module.

* * * * *